(12) United States Patent
Russ et al.

(10) Patent No.: US 7,888,775 B2
(45) Date of Patent: Feb. 15, 2011

(54) VERTICAL DIODE USING SILICON FORMED BY SELECTIVE EPITAXIAL GROWTH

(75) Inventors: Christian Russ, Diedorf (DE);
Christian Pacha, München (DE);
Snezana Jenei, München (DE); Klaus Schruefer, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/862,964

(22) Filed: Sep. 27, 2007

(65) Prior Publication Data

US 2009/0085163 A1    Apr. 2, 2009

(51) Int. Cl.
*H01L 27/08*    (2006.01)
(52) U.S. Cl. .................. 257/547; 257/544; 257/623; 257/624; 257/E27.051
(58) Field of Classification Search .................. 257/544, 257/547, 623, 624, E27.051
See application file for complete search history.

(56) References Cited

U.S. PATENT DOCUMENTS

| | | | |
|---|---|---|---|
| 4,373,255 A * | 2/1983 | Goronkin ................ 438/517 |
| 5,367,184 A * | 11/1994 | Chantre .................... 257/192 |
| 6,034,397 A | 3/2000 | Voldman |
| 6,261,911 B1 | 7/2001 | Lee et al. |
| 6,617,649 B2 | 9/2003 | Chang et al. |
| 6,645,820 B1 | 11/2003 | Peng et al. |
| 6,690,065 B2 | 2/2004 | Chang et al. |
| 7,138,313 B2 | 11/2006 | Chatty et al. |
| 2003/0006473 A1 * | 1/2003 | Rodov et al. ................. 257/493 |
| 2004/0031971 A1 * | 2/2004 | Shimoida et al. ............ 257/199 |
| 2005/0164476 A1 * | 7/2005 | Schulze et al. ............. 438/515 |
| 2007/0075391 A1 * | 4/2007 | Aslam et al. ................ 257/476 |
| 2008/0128762 A1 * | 6/2008 | Vora ........................... 257/288 |
| 2008/0227275 A1 * | 9/2008 | Seng et al. .................. 438/508 |
| 2009/0026586 A1 * | 1/2009 | Anderson ................... 257/623 |
| 2009/0090971 A1 * | 4/2009 | Chang et al. ............... 257/351 |

FOREIGN PATENT DOCUMENTS

| | | |
|---|---|---|
| DE | 10308313 A1 | 9/2004 |
| DE | 102004036278 A1 | 3/2006 |

OTHER PUBLICATIONS

"German Application Serial No. 1020080385525, Office Action (Translated) mailed May 28, 2009", 3 pg.
"German Application Serial No. 1020080385525, Response filed Oct. 6, 2009 to Office Action (Translated) mailed May 28, 2009", 31 pgs.

* cited by examiner

*Primary Examiner*—Victor A Mandala
(74) *Attorney, Agent, or Firm*—Schwegman Lundberg & Woessner, P.A.

(57) ABSTRACT

Some embodiments relate to an apparatus that exhibits vertical diode activity to occur between a semiconductive body and an epitaxial film that is disposed over a doping region of the semiconductive body. Some embodiments include an apparatus that causes both vertical and lateral diode activity. Some embodiments include a gated vertical diode for a finned semiconductor apparatus. Process embodiments include the formation of vertical-diode apparatus.

12 Claims, 9 Drawing Sheets

VERTICAL DIODE USING SILICON FORMED BY SELECTIVE EPITAXIAL GROWTH

TECHNICAL FIELD

Embodiments described herein relate generally to diodes and to gated diodes.

BACKGROUND

Diodes are used with microelectronic devices such as for electrostatic discharge protectants in sensitive solid-state circuits. Miniaturization is the process of crowding more devices, both passive and active, onto the same or an even smaller footprint of a microelectronic device. The crowding of more diodes into even smaller areas, poses significant challenges.

DETAILED DESCRIPTION

Figure 1:
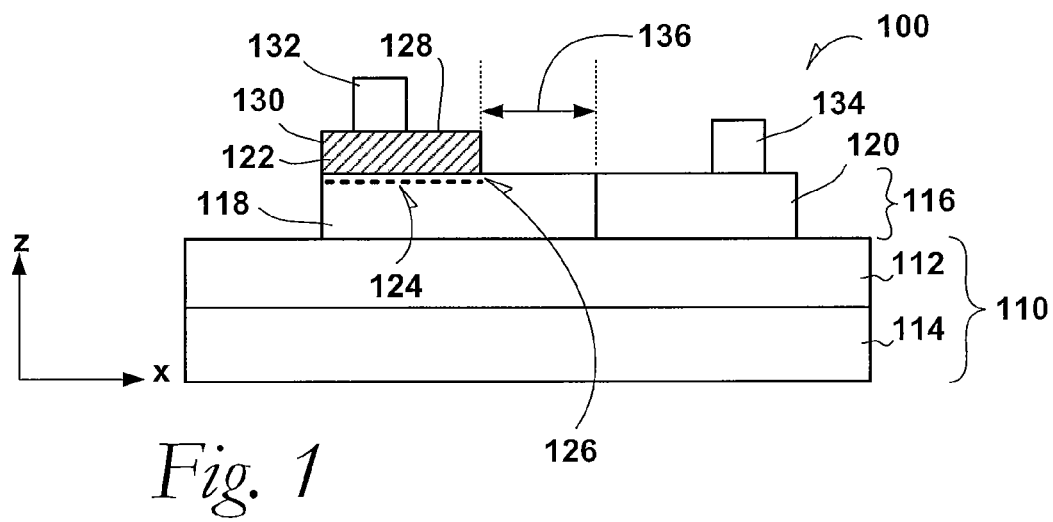
FIG. 1 is a cross-section elevation of an apparatus according to an embodiment.

The following detailed description refers to the accompanying drawings that show, by way of illustration, specific details and embodiments in which embodiments may be practiced. Other embodiments may be utilized and structural, logical, and electrical changes may be made without departing from the scope of the disclosed embodiments. The various embodiments are not necessarily mutually exclusive, as some embodiments can be combined with one or more other embodiments to form new embodiments. Like structures may be seen in the various figures with like reference numerals.

FIG. 1 is a cross-section elevation of an apparatus 100, according to an embodiment. A substrate 110 may include a dielectric substrate 112 such as a buried oxide (BOX) layer on a semiconductive substrate 114 to form a semiconductor on insulator (SOI) substrate in an embodiment. A semiconductive body 116 is disposed on the BOX layer 112, and the semiconductive body 116 includes a first section 118 and a second section 120. In an embodiment, the semiconductive body 116 is disposed upon the dielectric substrate 112. In an embodiment, the semiconductive body 116 is disposed upon a bulk semiconductor, in which case both the structure 112 and the structure 114 are semiconductor materials, and they may be integral.

The semiconductive body 116 may also be referred to as a semiconductive fin, or just a fin as understood within this disclosure. The first section 118 and the second section 120 may be differently doped, such as the first section 118 being undoped and the second section 120 being P+ doped. In an embodiment, the first section 118 is slightly P− doped to the second section 120 being P+ doped. In an embodiment, the first section 118 is slightly N-doped to the second section 120 being P+ doped. Other doping-difference schemes may be selected depending upon an application.

An epitaxial film 122 is disposed above and on the semiconductive body 116 at the first section 118. In an embodiment, epitaxial film 122 is grown upon selected regions of the semiconductive body 116. The semiconductive body 116 can therefore be referred to as a semiconductive seed layer 116, and the epitaxial film 122 can be referred to as a selective-growth (SEG) epitaxial film 122.

A diode junction 124 (represented by a dashed line) is formed at the semiconductive body 116. A diode junction boundary 126 exists at the diode junction 124 in relation to the semiconductive body 116. The diode junction 124 is configured to allow vertical-diode (z-direction) activity between the semiconductive body 116 at the first section 118 and the epitaxial film 122.

The epitaxial film 122 also exhibits a top surface 128 and a lateral surface 130. The apparatus 100 communicates to the outside world by a first contact 132, disposed on the epitaxial film 122 at the top surface 128, and by a second contact 134, disposed upon the semiconductive body 116 at the second section 120. Consequently, the contacts are coupleable to external structures. A diode distance 136 represents the electrical length of the diode that is formed by the apparatus 100.

It can be seen that the second contact 134 is vertically closer to the semiconductive body 116 than the first contact 132. This is because the second contact 134 is disposed directly upon the semiconductive body 116, and the first contact 132 is disposed upon the epitaxial film 122.

Figure 2F:
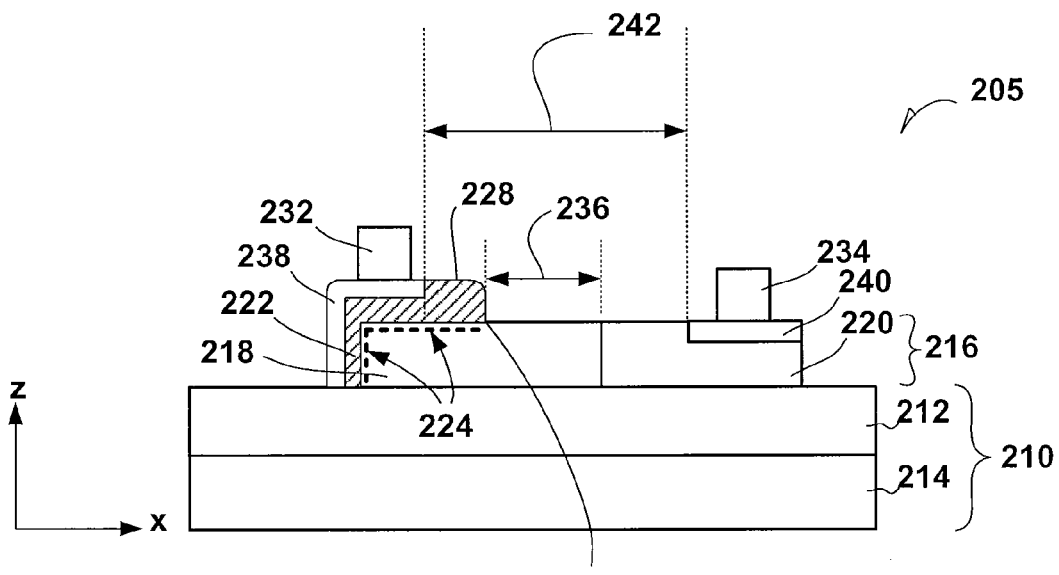
FIGS. 2a-2f represent cross-section elevations of an apparatus during processing according to an embodiment.

FIGS. 2a-2f represent a cross-section elevation of an apparatus during processing according to an embodiment. FIG. 2f is a cross-section elevation of an apparatus 205 that can exhibit vertical diode activity according to an embodiment. FIG. 2f represents a processed apparatus that is process-illustrated in FIGS. 2a, 2b, 2c, 2d, 2e, and 2f.

A substrate 210 may include a dielectric substrate 212 such as a BOX layer that is formed on a semiconductive layer 214 to form an SOI substrate in an embodiment. A semiconductive body 216 is disposed on the dielectric substrate 212, and the semiconductive body 216 includes a first section 218 and a second section 220. The semiconductive body 216 may also be referred to as a semiconductive fin, or just a fin as understood within this disclosure. In an embodiment, the semiconductive body 216 is a silicon seed layer 216. The first section 218 and the second section 220 may be differently doped, such as is set forth for the embodiments described in FIG. 1. In other embodiments, the semiconductive body 216 is doped differently depending upon the specific application.

An epitaxial film 222 is disposed above and on the semiconductive body 216 at the first section 218. The epitaxial film 222 may be an SEG film 222 according to process embodiments. A diode junction 224 (represented by a dashed line) is formed at the semiconductive body 216. A diode junction boundary 226 exists at the diode junction 224 in relation to the semiconductive body 216.

The epitaxial film 222 also exhibits a top surface 228 and a lateral surface. The lateral surface has been consumed, however, by a silicide first region 238, but some of the top surface 228 remains exposed adjacent to the silicide first region 238. The silicide first region 238 is formed in the epitaxial film 222 above the first section 218, and a silicide second region 240 is formed in semiconductive body 216 at the second section 220.

The diode junction 224 is configured to allow vertical-diode activity and lateral-diode activity between the semiconductive body 216 at the first section 218 and the epitaxial film 222.

The apparatus 205 communicates to the outside world by a first contact 232, disposed on the silicide first region 238 of the epitaxial film 222 at the top surface 228, and by a second contact 234, disposed upon the silicide second region 240 of the semiconductive body 216 at the second section 220. A diode distance 236 represents the electrical length of the diode that is formed by the apparatus 205. The silicide-blocking distance 242 represents the effect of masking during silicide formation, to obtain the spaced-apart silicide first region 238 and silicide second region 240, respectively.

It can be seen that the second contact 234 is vertically (z-direction) closer to the semiconductive body 216 than the first contact 232. This is because the second contact 234 is disposed directly upon the semiconductive body 216 at the silicide second region 240, and the first contact 232 is disposed upon the silicide first region 238, which was formed from the epitaxial film 222.

Figure 2A:
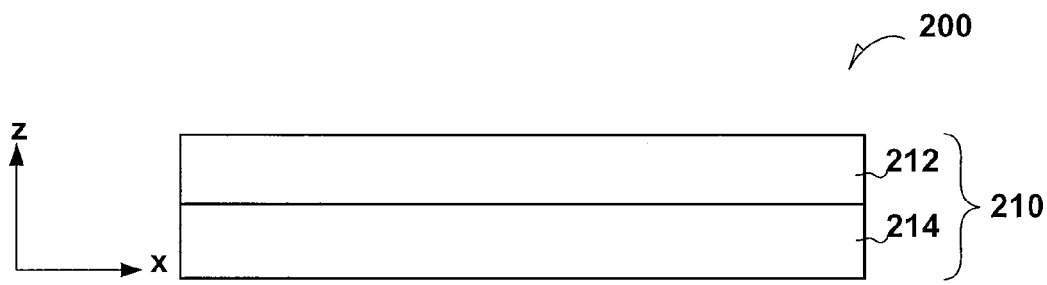

FIG. 2a is a cross-section elevation of an apparatus 200 during fabrication according to an embodiment. The apparatus 200 depicted in FIG. 2a will be processed and described through FIG. 2f to attain the apparatus 205. The substrate 210 includes a dielectric substrate 212 such as a BOX layer that is formed on a semiconductive layer 214 to form an SOI substrate in an embodiment.

Figure 2B:
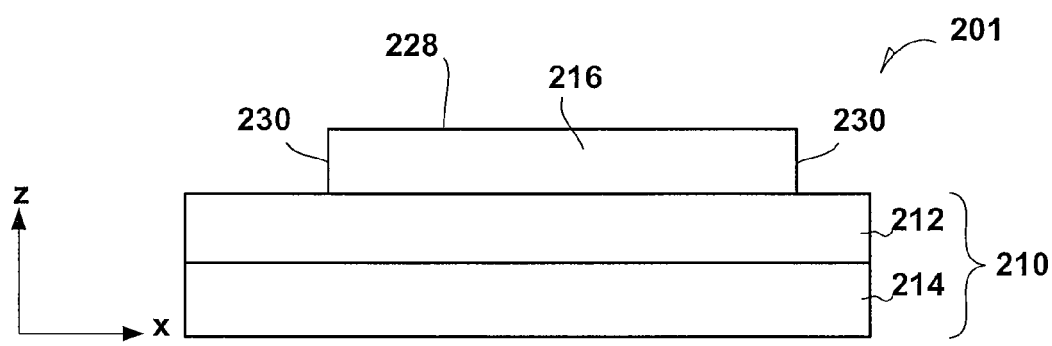

FIG. 2b is a cross-section elevation of the apparatus depicted in FIG. 2a after further processing according to an embodiment. The apparatus 201 is further processed by the placement of a semiconductive body 216 on the dielectric substrate 212. The semiconductive body 216 can be silicon, and can be referred to as a "seed silicon", or more generally, a "seed semiconductor" to facilitate the formation of an epitaxial film upon the semiconductive body 216. The semiconductive body 216 has been patterned to exhibit the lateral (x-dimension) footprint of a diode device that is being fabricated. The semiconductive body 216 exhibits both an upper surface 228 and lateral surfaces 230.

Figure 2C:
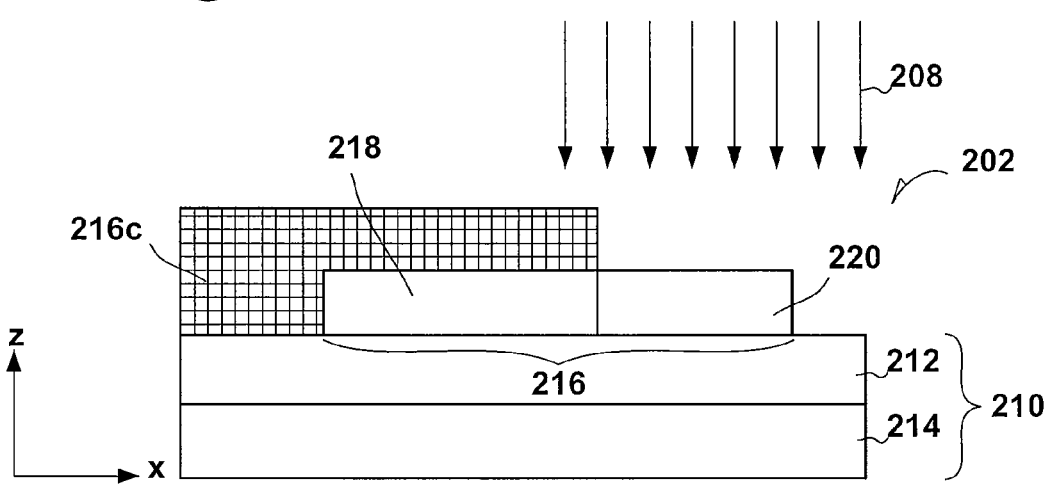

FIG. 2c is a cross-section elevation of the apparatus depicted in FIG. 2b after further processing according to an embodiment. The apparatus 202 is further processed by implantation of a portion of the semiconductive body 216. A first mask 216c allows for a first section 218 of the semiconductive body 216 to be protected during ion implantation, and a second section 220 of the semiconductive body 216 is implanted. The directional arrows 208 represent ion implantation. In any event, the first mask 216c allows the first section 218 to be differently doped from the second section 220, such as is set forth for the embodiments described in FIG. 1. Other doping-difference schemes may be carried out depending upon a given application.

Figure 2D:
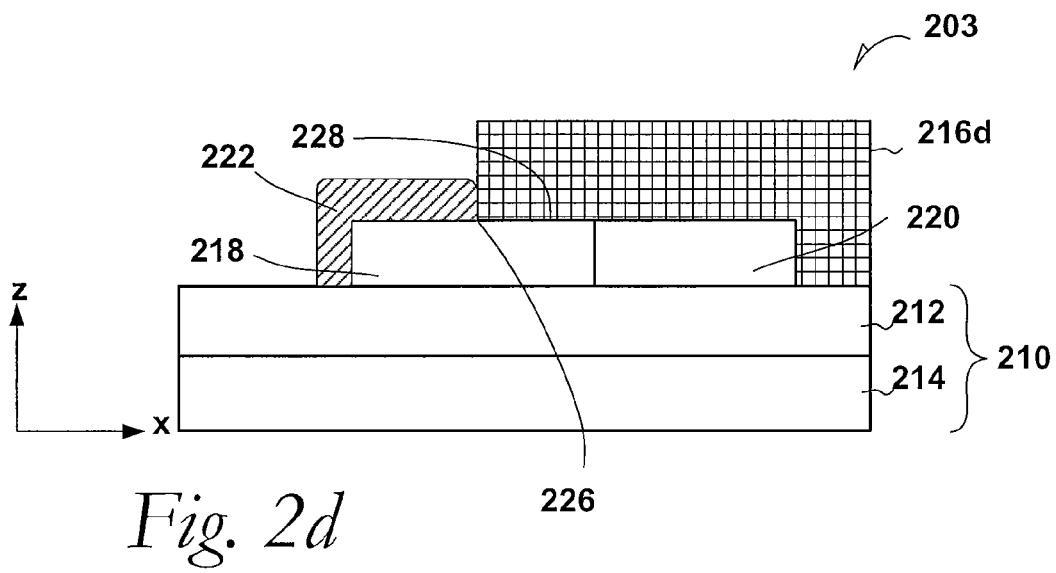

FIG. 2d is a cross-section elevation of the apparatus depicted in FIG. 2c after further processing according to an embodiment. The apparatus 203 is further processed by the selective epitaxial growth (SEG) of the epitaxial film 222. A second mask 216d blocks a portion of the semiconductive body 216, such that the epitaxial film 222 forms opposite the second mask 216d. In an embodiment, the epitaxial film 222 is doped in situ during SEG-film growth. In an embodiment, the epitaxial film 222 is first grown such as by SEG processing, and the second mask 216d may be used as a blocking second mask, to allow for ion implantation of the epitaxial film 222. When ion implantation is carried out, however, some or all of the lateral portion of the epitaxial film 222 is doped to a higher concentration as compared to the exposed upper portion at the top surface 228.

Figure 2E:
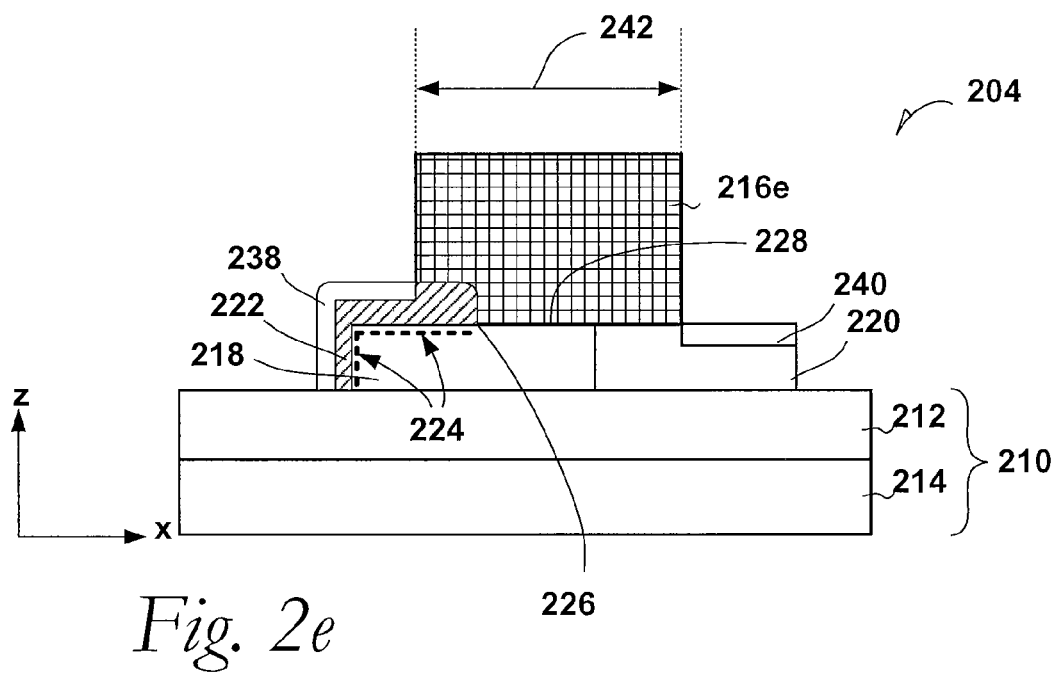

FIG. 2e is a cross-section elevation of the apparatus depicted in FIG. 2d after further processing according to an embodiment. The apparatus 204 is further processed by formation of a third mask 216e that facilitates a silicide block of a portion of the apparatus 204, during the growth of the silicide first region 238 and the silicide second region 240. In an embodiment, the third mask 216e is a hard nitride mask such as a silicon nitride material, that resists the growth of silicides. It can be seen that the silicide first region 238 has formed on the upper surface 228 and has consumed a part of the lateral surface and the vertical surface of the epitaxial film 222.

Reference is again made to FIG. 2f. It can be seen that the third mask 216e has left a spaced-apart silicide first region 238, from the silicide second region 240. The presence of silicide can lower resistance for the diode apparatus 205. A silicide-blocking distance 242 represents the effect of masking during silicide formation, to obtain the spaced-apart silicide first region 238 and silicide second region 240, respectively.

Figure 3:
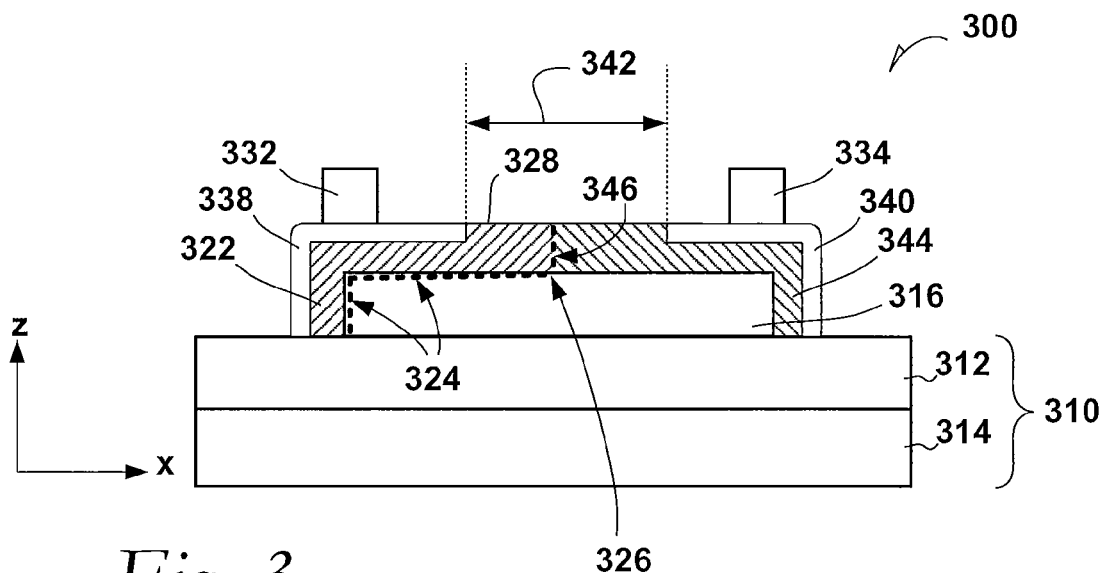
FIG. 3 is a cross-sectional elevation of an apparatus that can exhibit vertical-diode activity according to an embodiment.

FIG. 3 is a cross-sectional elevation of an apparatus 300 that can exhibit vertical-diode activity according to an embodiment. A substrate 310 may include a dielectric substrate 312 upon a semiconductive substrate 314, to form a BOX layer 312 to form an SOI substrate in an embodiment. A semiconductive body 316 is disposed on the BOX layer 314. The semiconductive body 316 may also be referred to as a semiconductive fin, or just a fin as understood within this disclosure. An epitaxial film 322 is disposed above and on the semiconductive body 316, where the semiconductive body 316 has acted as a seed layer. Hereinafter, the epitaxial film 322 is referred to as an epitaxial first film 322. An epitaxial second film 344 is also disposed above and on the semiconductive body 316. A first diode junction 324 (represented by a dashed line) is formed at the semiconductive body 316. A diode first boundary 326 is also indicated. A second diode junction 346 is also exhibited between the epitaxial first film 322 and the epitaxial second film 344.

The epitaxial first film 322 also exhibits a top surface 328 and a lateral surface. The lateral surface has been in part consumed, however, by a silicide first region 338, but some of the top surface 328 remains exposed adjacent to the silicide first region 338. The epitaxial second film 344 also exhibits the top surface 328 and a lateral surface. The lateral surface has also been in part consumed, however, by a silicide second region 340, but some of the top surface 328 remains exposed adjacent to the silicide second region 340. The silicide first region 338 is formed in the epitaxial first film 322 above the semiconductive body 316 and the silicide second region 340 is formed in the epitaxial second film 344 above semiconductive body 316. A silicide-blocking distance 342 represents the effect of masking during silicide formation, to obtain the spaced-apart silicide first region 338 and silicide second region 340, respectively.

The first diode junction 324 is configured to allow vertical-diode activity and lateral-diode activity between the semiconductive body 316 and the epitaxial first film 322. In an embodiment, the first diode junction 324 is locatable below the epitaxial second film 344, between the epitaxial second film 344 and the semiconductive body 316. The location of the first diode junction, however, whether it is below the epitaxial first film 322 or the epitaxial second film 344, will be selected based upon a given application and doping rules.

A second diode junction 346 can also occur between the epitaxial first film 322 and the epitaxial second film 344. In an embodiment, the apparatus 300 can exhibit two diode activities; one at the first diode junction 324, and another at the second diode junction 346. Consequently, forward- and reverse breakdown can be tailored with the first- and second diode junctions 324 and 346, respectively.

The apparatus 300 communicates to the outside world by a first contact 332, disposed on the epitaxial first film 322 at the top surface 328, and by a second contact 334, disposed upon the epitaxial second film 344, also at the top surface 328. Consequently, the contacts are coupleable to external structures.

Figure 4:
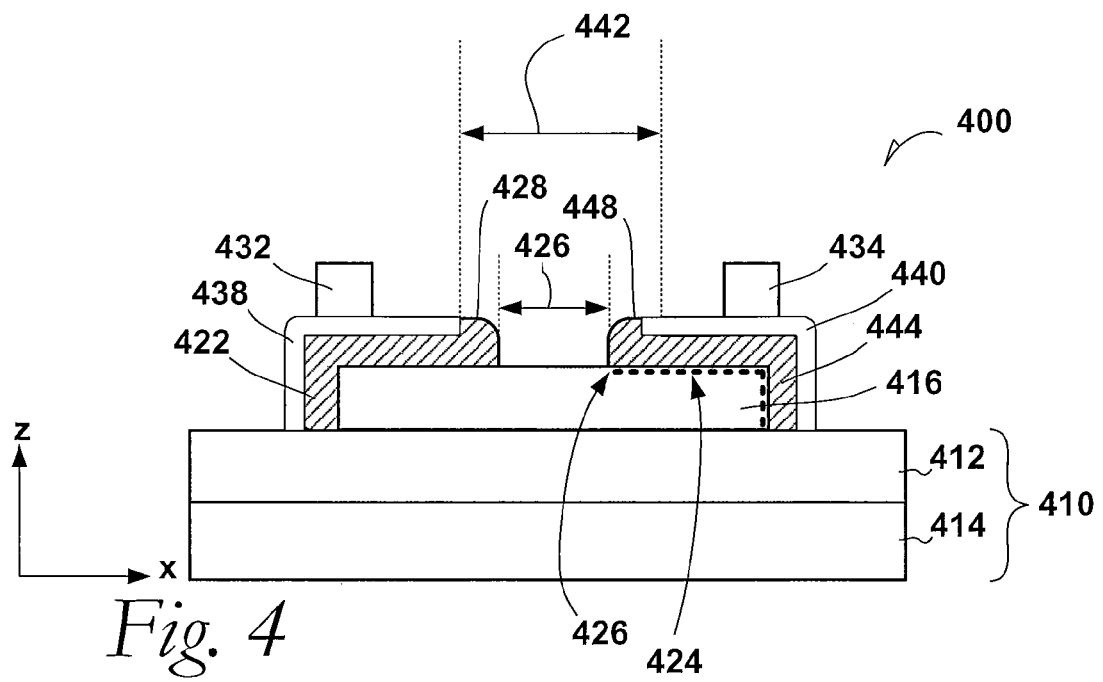
FIG. 4 is a cross-sectional elevation of an apparatus that can exhibit lateral- and vertical-diode activity according to an embodiment.

FIG. 4 is a cross-sectional elevation of an apparatus 400 that can exhibit lateral- and vertical-diode activity according to an embodiment. A substrate 410 may include a dielectric substrate 412 upon a semiconductive substrate 414, to form a BOX layer 412 to form an SOI substrate in an embodiment. A semiconductive body 416 is disposed on the BOX layer 412. The semiconductive body 416 may also be referred to as a semiconductive fin, or just a fin as understood within this disclosure.

An epitaxial film 422 is disposed above and on the semiconductive body 416. Hereinafter, the epitaxial film 422 is referred to as an epitaxial first film 422. An epitaxial second film 444 is also disposed above and on the semiconductive body 416. In an embodiment, the epitaxial first film 422 and the epitaxial second film 444 are formed during distinct SEG processes, such as an in situ N+ SEG process for the epitaxial first film 422 and an in situ P+ process for the epitaxial second film 444. In an embodiment, where the epitaxial first film 422 is in situ N+ SEG processed, and where the epitaxial second film 444 is in situ P+ processed, the fin 416 is a semiconductive body 416 that is one of P−, N−, seed silicon.

A diode junction 424 (represented by a dashed line) is formed at the semiconductive body 416. A diode first boundary 426 is also indicated. The epitaxial first film 422 also exhibits a top surface 428 and a lateral surface. The lateral surface has been consumed, however, by a silicide first region 438, but some of the top surface 428 remains exposed adjacent to the silicide first region 438. The epitaxial second film 444 also exhibits the top surface 448 and a lateral surface. The lateral surface has also been consumed, however, by a silicide second region 440, but some of the top surface 448 remains exposed adjacent to the silicide second region 440.

The diode junction 424 is configured to allow vertical-diode activity and lateral-diode activity between the semiconductive body 416 and the epitaxial second film 444. In an embodiment, the diode junction 424 may be locatable below the epitaxial first film 444, between the epitaxial first film 444 and the semiconductive body 416. The diode junction location, whether below the epitaxial first film 422 or the epitaxial second film 444, will be selected based upon a given application and doping rules.

The apparatus 400 communicates to the outside world by a first contact 432, disposed on the silicide first region 438 of the epitaxial first film 422 at the top surface 428, and by a second contact 434, disposed upon the epitaxial second film 444, also at the top surface 448. Consequently, the contacts are coupleable to external structures. A diode distance 426 represents the electrical length of the diode that is formed by the apparatus 400. An epitaxial-film blocking distance 426 represents the effect of masking during epitaxial film formation, to obtain the spaced-apart epitaxial first film 422 and the epitaxial second film 444. A silicide blocking distance 442 represents the effect of masking during silicide formation.

Figure 5:
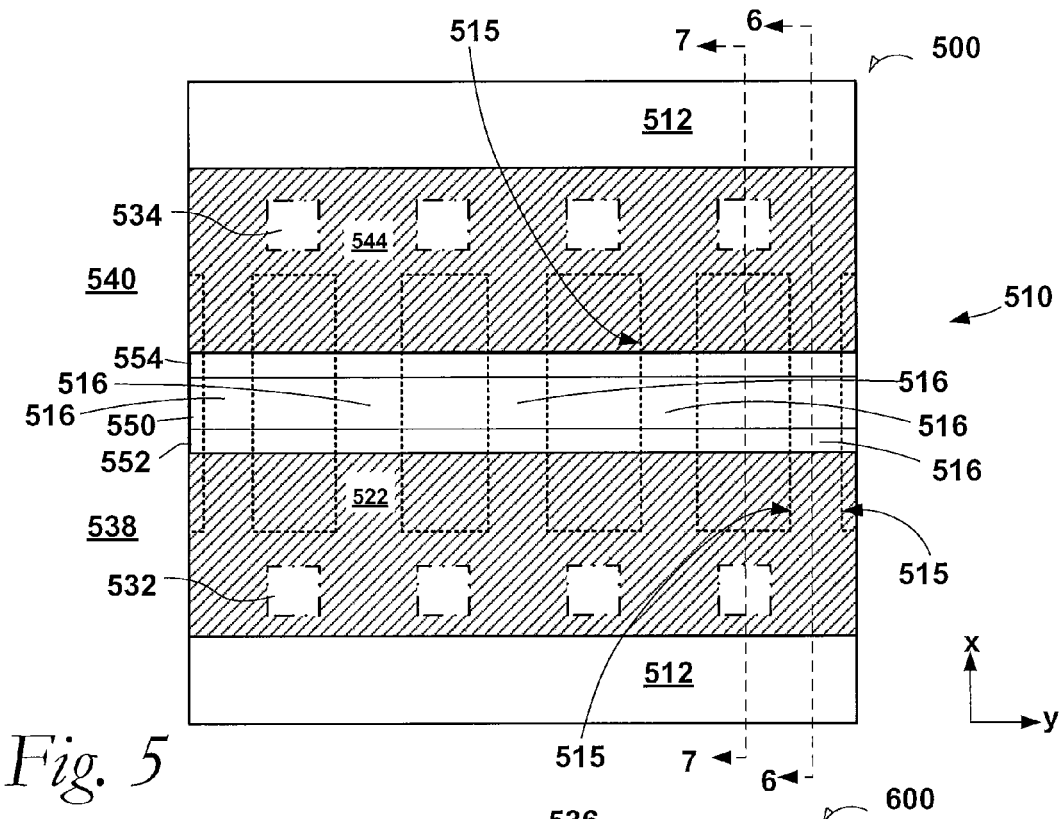
FIG. 5 is a top plan of an apparatus that can exhibit vertical-diode activity according to an embodiment.

FIG. 5 is a top plan of an apparatus 500 according to an embodiment. A portion of the structures are removed and others are presented in phantom lines for clarity. A substrate may include a dielectric substrate 512 upon a semiconductive substrate that is obscured in this illustration (see FIGS. 6 and 7), to form a BOX layer 512 that in turn can form an SOI substrate in an embodiment. A semiconductive body 516 is represented with recesses 515 formed therein between rows of contacts 532 and 534. The contacts 532 and 534, however, are depicted only as projections upon the epitaxial second film 544.

The semiconductive body 516 is disposed on the BOX layer 512 and the semiconductive body 516 has been etched to form fins 516 that are defined in part by the recesses 515. As the semiconductive body 516 may include sections that are not in a fin shape, the reference to the fin 516 is that portion between two recesses 515, and consequently that fin portion 516 that is used as a diode structure.

In an embodiment, multiple semiconductor bodies are connected in parallel as illustrated, by coupling a first section to a first group of contacts 532, and a second section to a second group of contacts 534. This configuration allows for adjusting the current drivability of a diode that includes multiple fin bodies 516.

An epitaxial first film 522 is disposed above and on the semiconductive body 516. The epitaxial second film 544 is also disposed above and on the semiconductive body 512. These films are exposed such that the silicide films have been omitted from the illustration.

The epitaxial first film 522 also exhibits a top surface and a lateral surface, although the top- and lateral surfaces are partly consumed during silicidation. The epitaxial second film 544 also exhibits a top surface and a lateral surface. FIG. 5 also illustrates a gate 550 and spacers 552 and 554.

Figure 6:
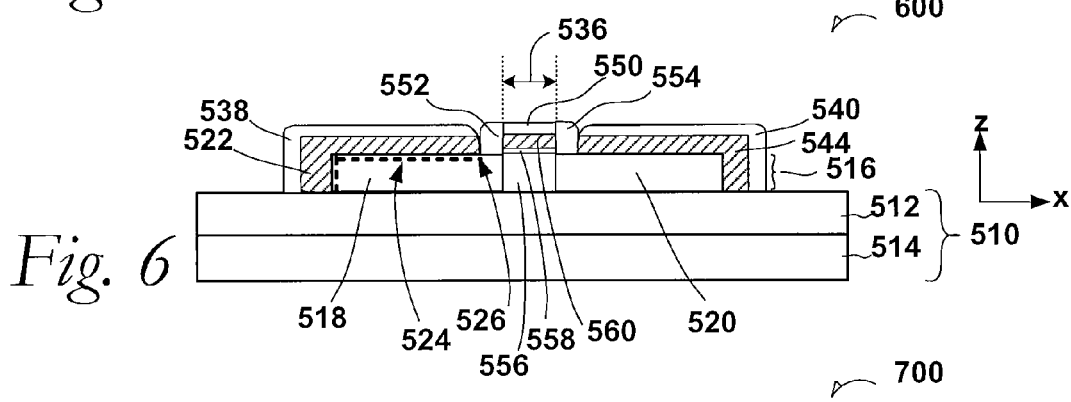
FIG. 6 is a cross-sectional elevation of the apparatus depicted in FIG. 5, taken along the section line 6-6 according to an embodiment.

FIG. 6 is a cross-sectional elevation of the apparatus depicted in FIG. 5, taken along the section line 6-6 according to an embodiment. The substrate 510 is illustrated with a dielectric substrate 512 upon a semiconductive substrate 514. The semiconductive body 516 is disposed on the BOX layer 512 in this embodiment. The semiconductive body 516 may also be referred to as a semiconductive fin, or just a fin as understood within this disclosure. The epitaxial first film 522 is disposed above and on the semiconductive body 516, as well as the epitaxial second film 544. A diode junction 524 (represented by a dashed line) is formed at the semiconductive body 516 below the epitaxial first film 522. The diode junction 524 is configured to allow vertical-diode activity and lateral-diode activity between the semiconductive body 516 and the epitaxial first film 522. A diode first boundary 526 is also indicated.

In an embodiment, the diode junction 524 is locatable below the epitaxial second film 544. The diode junction location, whether below the epitaxial first film 522 or the epitaxial second film 544, will be selected based upon a given application and doping rules.

Figure 7:
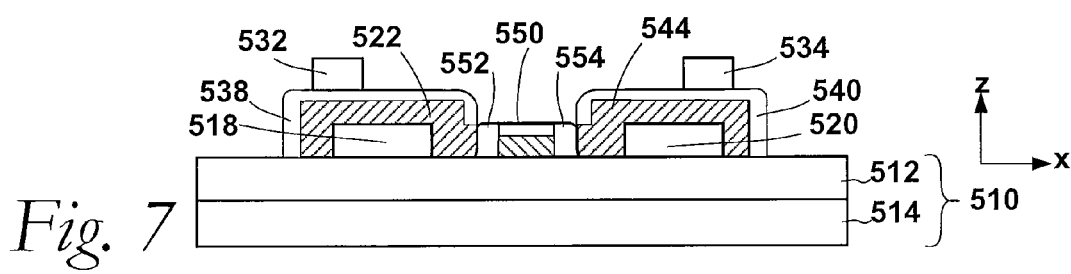
FIG. 7 is a cross-sectional elevation of the apparatus depicted in FIG. 5, taken along the section line 7-7 according to an embodiment.

Now referring to FIG. 7, the apparatus 500 communicates to the outside world by a group of contacts, one of which is the first contact 532. The first contact is disposed on the silicide first region 538 of the epitaxial first film 522, and by a group of contacts, one of which is the second contact 534. The second contact is disposed on the silicide second region 540 of upon the epitaxial second film 544. Consequently, the contacts are coupleable to external structures. The apparatus 500 also communicates to the outside world by the gate silicide 550 and a gate layer 560. A gate length 536 represents the approximate electrical length of the silicided-gate diode that is formed by the apparatus 500.

The gate silicide 550 is part of a gate-stack structure with the spacers 552 and 554 and the gate layer 560 that is disposed above and on the semiconductive body 516. The gate silicide 550 is formed above the gate layer 560, which has been grown according to an embodiment. In an embodiment, the gate layer 560 is a metal. In an embodiment, the gate layer 560 is a thin layer of metal adjacent to the gate dielectric layer 558. In an embodiment, the gate layer 560 is a polycrystalline silicon that is grown upon the gate dielectric layer 558, which may be formed by oxidation.

The gate dielectric layer 558 is disposed above and on the fin-shaped semiconductive body 556. In an embodiment, the gate dielectric layer 558 is an oxide. In an embodiment, the gate dielectric layer 558 is an oxynitride.

Further to FIG. 6, the semiconductive body 516 can be seen to be sectioned according to doping, into a first doping region 518, a second doping region 520, and the fin-shaped (finned) semiconductive body 556, which together can also be referred to as a FINFET doping region 556. The first doping region 518 and the second doping region 520 of the semiconductive body 516 may be differently doped, such as in an embodiment, the first doping region 518 is N– extension implanted and the second doping region 520 is P– extension implanted. In this embodiment the first contact 532 is referred to as a cathode and the second contact 534 is referred to as an anode.

The FINFET doping region 556 may also be differently doped from the first doping region 518 and the second doping region 520. The FINFET doping region 556 may also be similarly doped with respect to one of the first doping region 518 or the second doping region 520 or it may be undoped.

FIG. 7 is a cross-sectional elevation of the apparatus depicted in FIG. 5, taken along the section line 7-7 according to an embodiment. The substrate 510 includes the dielectric substrate 512 upon the semiconductive substrate 514. The semiconductive body 516 is disposed on the BOX layer 514. The epitaxial first film 522 and the epitaxial second film 544 are also disposed above and on the semiconductive body 516.

The epitaxial first film 522 as well as the epitaxial second film 544 have been covered with the respective silicide first region 538 and silicide second region 540. The gate structure has acted as a blocking structure to prevent a shorting merger between the silicide first region 538 and silicide second region 540.

Figure 8:
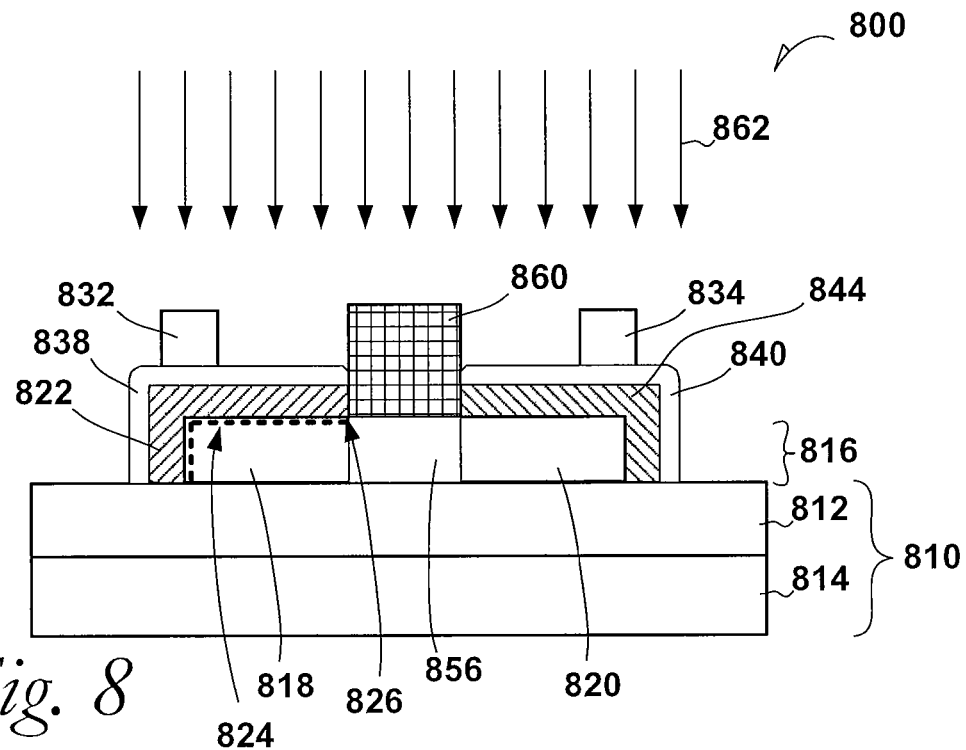
FIG. 8 is a cross-sectional elevation of an apparatus that can exhibit vertical-diode activity according to an embodiment.

FIG. 8 is a cross-sectional elevation of an apparatus according to an embodiment. A substrate 810 is illustrated with a dielectric substrate 812 upon a semiconductive substrate 814. A semiconductive body 816 is disposed on the BOX layer 812. The semiconductive body 816 may also be referred to as a semiconductive fin, or just a fin as understood within this disclosure. An epitaxial first film 822 is disposed above and on the semiconductive body 816, as well as an epitaxial second film 844. A diode junction 824 (represented by a dashed line) is formed at the semiconductive body 816 below the epitaxial first film 822. A diode first boundary 826 is also indicated. The diode junction 824 is configured to allow vertical-diode activity and lateral-diode activity between the semiconductive body 816 and the epitaxial first film 822. In an embodiment, the diode junction 824 is locatable below the epitaxial second film 844. The diode junction location, whether below the epitaxial first film 822 or the epitaxial second film 844, will be selected based upon a given application and doping rules.

In a process embodiment, both the epitaxial first film 822 and the epitaxial second film 844 are grown at the same time. A nitride mask 860 is used to block the growth of silicide, and it also is used to facilitate a self-aligned growth of the SEG films 822 and 844.

In an embodiment, the N+ and P+ source/drain masks are alternatively used to implant each of the epitaxial first film 822 and the epitaxial second film 844. The implantation process 862 therefore may be two separate implantation processes, and implantation processes are used to dope the SEG films 822 and 844 as well as selected parts of the semiconductive body 816 disposed upon the dielectric substrate 812. Further, the nitride mask 860 also prevents unplanned implantation doping 862 of the FINFET doping region 856. The first doping region 818 and the second doping region 820 of the semiconductive body 816 may be differently doped. The FINFET doping region 856 may also be differently doped from the first doping region 818 or the second doping region 820. The FINFET doping region 856 may also be similarly doped with respect to one of the first doping region 818 or the second doping region 820.

The apparatus 800 communicates to the outside world by a first contact 832, disposed on the silicide first region 838 of the epitaxial first film 822, and by a second contact 834, disposed on the silicide second region 840 of the epitaxial second film 844. Consequently, the contacts are coupleable to external structures. It can now be appreciated that the semiconductive body 816 can be configured as a semiconductive fin.

Figure 9:
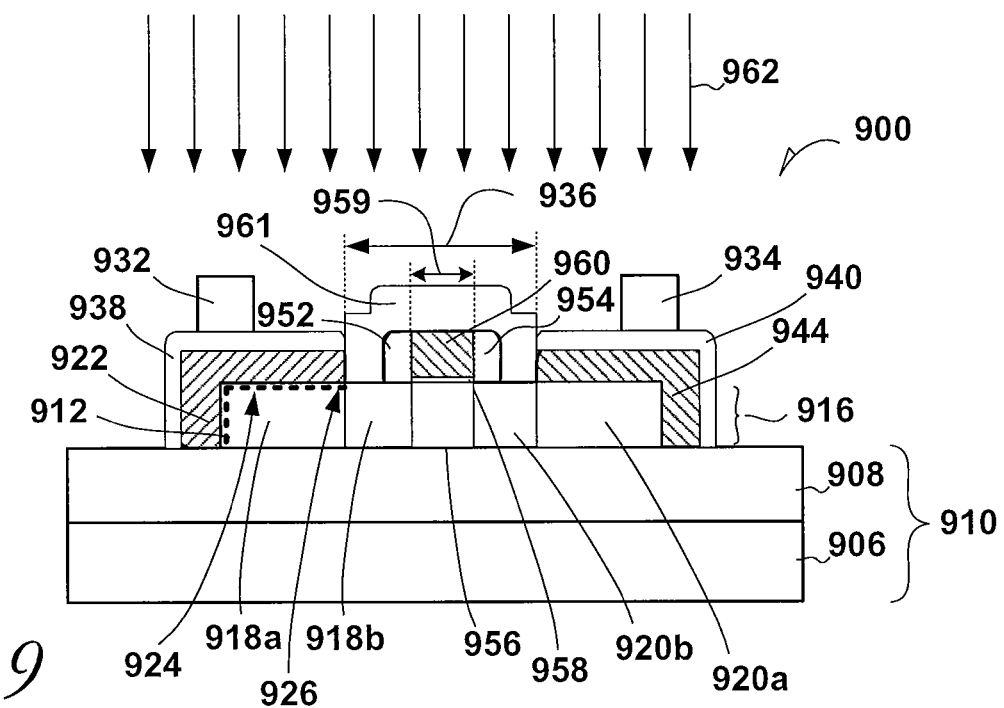
FIG. 9 is a cross-sectional elevation of an apparatus that can exhibit vertical-diode activity according to an embodiment.

FIG. 9 is a cross-sectional elevation of an apparatus that can exhibit vertical-diode activity according to an embodiment. A substrate 910 is illustrated with a dielectric substrate 912 upon a semiconductive substrate 914. A semiconductive body 916 is disposed on the BOX layer 912. The semiconductive body 916 may also be referred to as a semiconductive fin, or just a fin as understood within this disclosure. An epitaxial first film 922 is disposed above and on the semiconductive body 916, as well as an epitaxial second film 944. A diode first boundary 926 is also indicated.

A diode junction 924 (represented by a dashed line) is formed at the semiconductive body 916 below the epitaxial first film 922. The diode junction 924 is configured to allow vertical-diode activity and lateral-diode activity between the semiconductive body 916 and the epitaxial first film 922. In an embodiment, the diode junction 924 may be locatable below the epitaxial second film 944. The diode junction location, whether below the epitaxial first film 922 or the epitaxial second film 944, will be selected based upon a given application and doping rules.

The gate spacers 952 and 954 and a gate dielectric layer 958 are part of the gate structure. The gate dielectric layer 958 is disposed above and on the FINFET doping region 956.

Further to FIG. 9, the semiconductive body 916 can be seen to be sectioned according to doping, into a first doping region 918, a second doping region 920, and the FINFET doping region 956 of the semiconductive body 916.

In a process embodiment, a gate layer 960 is first formed, followed by extension implantation of the semiconductive body 916 on each side of the gate layer 960. Next, gate spacers 952 and 954 are formed, such as nitride materials, as well as the hard mask 961. Growth of the SEG films 922 and 944 may follow, such that the hard mask 961 acts as a blocking mask to prevent SEG film formation.

Doping of regions not protected by the hard mask 961 may next be carried out such as N+ doping of the first doping region 918a, and P+ doping of the second doping region 920a. These doping processes may be done by alternatively photomasking each of the first doping region 918a and the second region 920a.

Thereafter, silicidation of the silicide first region 938 and of the silicide second region 940 may be carried out.

In a process embodiment, both the epitaxial first film 922 and the epitaxial second film 944 are grown at the same time. Nitride hard masks may be used to block the growth of silicide above what becomes the first doping region 918b and the second doping region 920b. The masks may also be used to facilitate a self-aligned growth of the SEG films 922 and 944.

In an embodiment, the N+ and P+ source/drain masks are alternatively used to implant each of the epitaxial first film 922 and the epitaxial second film 944. The implantation process 962 therefore may be two separate implantation processes, and implantation processes are used to dope the SEG films 922 and 944 as well as selected parts of the semiconductive body 916 disposed upon the dielectric substrate 912.

The FINFET doping region 956 exhibits multiple electrical properties similarly to the gate structure depicted in FIG. 6. Consequently, a multiple-fin FET apparatus 900 is formed of the various structures of the apparatus 600 when they are used in concert to act upon the FINFET doping region 956 of the semiconductive body 916.

In a process embodiment, both the epitaxial first film 922 and the epitaxial second film 944 are grown at the same time. The N+ and P+ source/drain masks and implantation processes are used to dope parts of the SEG films 922 and 944 as well as parts of the semiconductive body 916 disposed upon the dielectric substrate 912. The nitride hard mask 961 is used to block the growth of silicide, and it also is used to facilitate a self-aligned SEG growth of the SEG films 922 and 944. Further, the nitride hard mask 961 also prevents unplanned implantation dopings 962 of the FINFET doping region 956. A diode distance 936 represents the electrical length of the diode that is formed by the FINFET diode apparatus 900.

The first doping region 918 and the second doping region 920 of the semiconductive body 916 may be differently doped. The first doping region 918 is doped differently as a first doping region 918a and a first doping region 918b. The different doping may arise due to fabrication with the presence or absence of various structures including the gate spacers 952 and 954 and the mask 961. Similarly, the second doping region 920 is doped differently as a second doping region 920a and a second doping region 920b. The FINFET doping region 956 may also be differently doped from the first doping region 918 and the second doping region 920. The FINFET doping region 956 may also be similarly doped with respect to one of the first doping region 918 or the second doping region 920. A FINFET diode apparatus 900 of this type may be used to provide long and quasi-graded anode and cathode regions for lowered leakage and increased reverse breakdown voltages, while still making use of the low resistivity and thermally useful SEG films.

The apparatus 900 communicates to the outside world by the first contact 932, disposed on the silicide first region 938 of the epitaxial first film 922, and by a second contact 934, disposed on the silicide second region 940 of the epitaxial second film 944. Consequently, the contacts are coupleable to external structures. The apparatus 900 also communicates to the outside world through a gate structure that includes the gate layer 960 that exhibits a gate length 959. It can now be appreciated that the semiconductive body 916 can be configured as a semiconductive fin.

Figure 10:
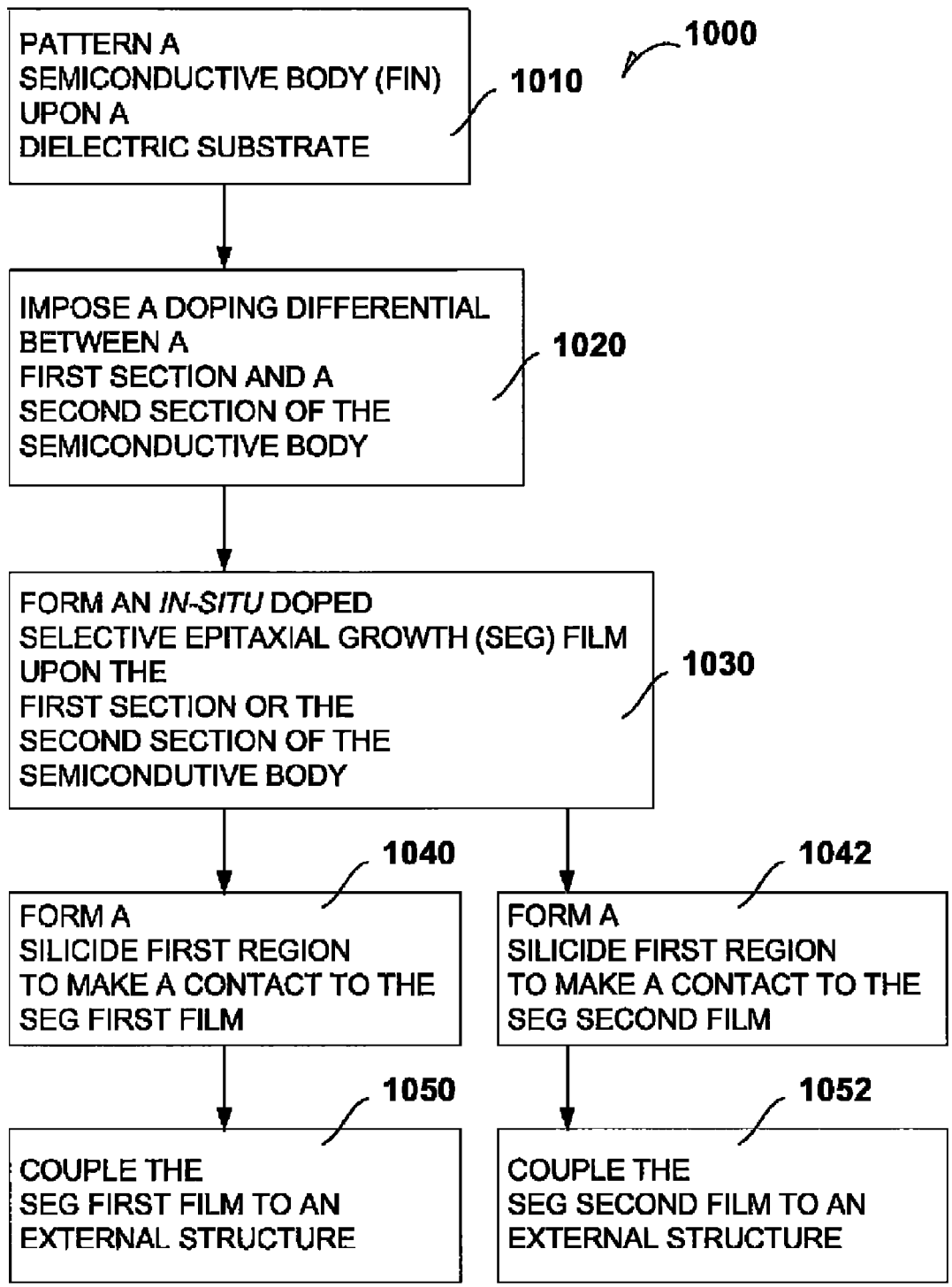
FIG. 10 is a process-flow diagram according to some embodiments.

FIG. 10 is a process-flow diagram according to some embodiments.

At 1010, the process includes patterning a semiconductive body upon a dielectric substrate.

At 1020, the process includes imposing a doping differential between a first doping region of the semiconductive body and a second doping region of the semiconductive body.

At 1030, the process includes forming an in situ doped SEG film upon the first doping region or upon the second doping region of the semiconductive body.

At 1040, the process includes forming a silicide first region to make contact to the SEG first film. Alternatively or additionally, at 1042, the process includes forming a silicide second region to make contact to the SEG second film.

At 1050, the process includes coupling the SEG first film to an external structure. At 1052, the process includes coupling the SEG second film to an external structure.

Figure 11:
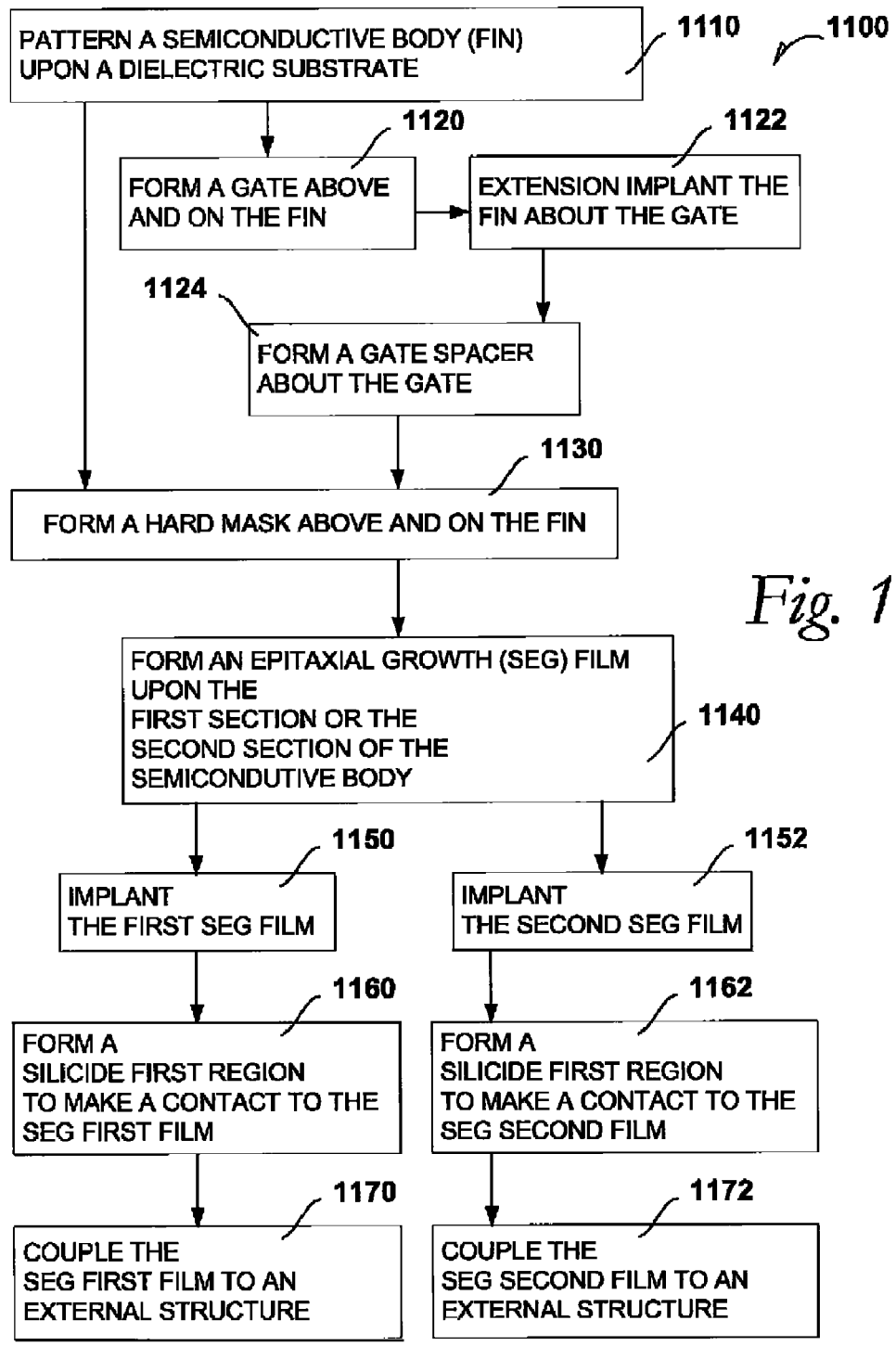
FIG. 11 is a process-flow diagram according to some embodiments.

FIG. 11 is a process-flow diagram according to some embodiments.

At 1110, the process includes patterning a semiconductive body, also referred to as a fin, upon a dielectric substrate.

At 1120, the process includes forming a gate above and on the fin.

At 1122, the process includes extension implanting the fin about the gate.

At 1124, the process includes forming a gate spacer about the gate.

At 1130, the process includes forming a hard mask above and on the semiconductive fin. In a non-limiting example embodiment, a first photo mask and resist covers the semiconductive body at the second doping region while implantation is carried out in the semiconductive body at the first section. Similarly, a subsequent photo mask and resist covers the semiconductive body at the first doping region while implantation is carried out in the semiconductive body at the second section.

It can also be seen at 1130 that processing may proceed directly from 1110 to 1130 as is illustrated in FIG. 8

At 1140, the process includes forming an SEG film upon the first doping region or upon the second doping region of the semiconductive body.

At 1150, the process includes implanting the first SEG film. Alternatively or additionally, at 1152, the process includes implanting the second SEG film.

At 1160, the process includes forming a silicide first region to make contact to the SEG first film. Alternatively or additionally, at 1162, the process includes forming a silicide second region to make contact to the SEG second film.

At 1170, the process includes coupling the SEG first film to an external structure. At 1172, the process includes coupling the SEG second film to an external structure.

Figure 12:
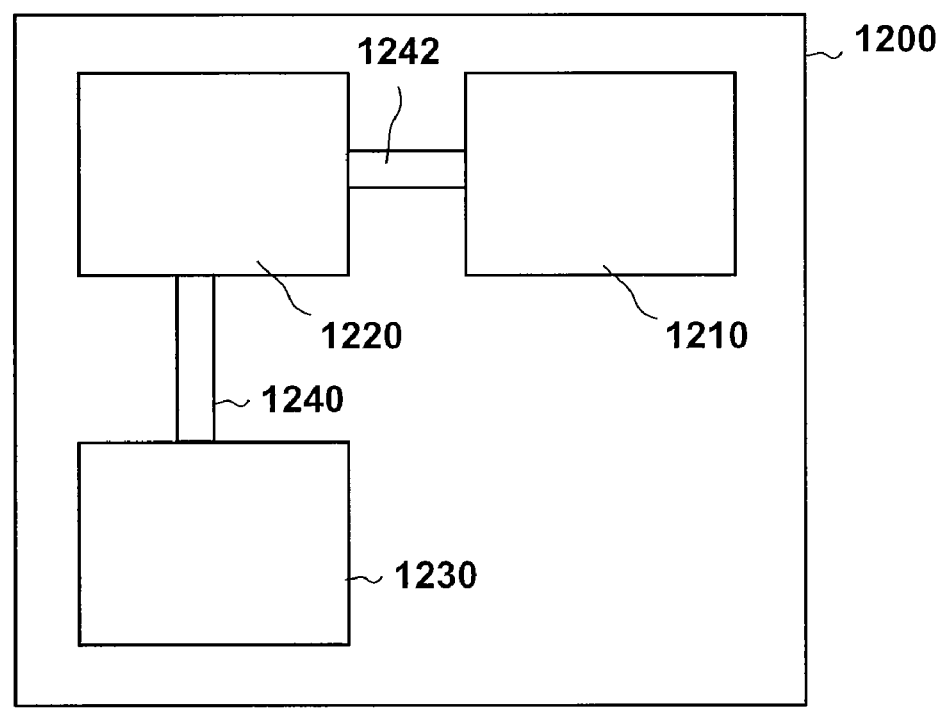
FIG. 12 is a illustrates an electronic device that includes vertical-diode apparatus embodiment such described herein.

FIG. 12 illustrates an electronic device 1200 that includes a vertical-diode apparatus embodiment such described above. The electronic device 1200 can be referred to as an external structure. Components of the electronic device 1200 can also be referred to as an external structure. Further, sub-components, such as first area of a semiconductive device that on the same chip of a vertical-diode apparatus embodiment can also be referred to as an external structure.

The electronic device 1200 includes a first component 1220 that benefits from coupling to a vertical-diode apparatus. Examples of the first component 1220 include electrostatic discharge (ESD) functionalities such as in an output driver. Another example of the first component 1220 includes an ESD functionality in a logic circuit. In these examples, device operation is improved with the presence of a vertical-diode apparatus.

In an embodiment, the device 1200 further includes a power source 1230. The power source 1230 is electrically connected to the first device component 1220 using interconnecting circuitry 1240. In an embodiment, the interconnecting circuitry 1240 includes a vertical-diode apparatus embodiment.

In an embodiment, the device 1200 further includes a second device component 1210. The second component is electrically connected to the first component 1220 using interconnecting circuitry 1242. Likewise, in one embodiment, the interconnecting circuitry 1242 includes a vertical-diode apparatus embodiment. Examples of second device components 1210 include signal amplifiers, memory structures, logic circuitry, output circuits, ESD circuits, or other microprocessing apparatus. Aside from interconnecting circuitry, in an embodiment, the first device component 1220 and/or the second device component 1210 includes vertical-diode apparatus embodiment formed according to process embodiments described above.

Embodiments disclosed herein are suitable for application in embodiments of microelectronic devices that require passive devices near the microelectronic portions. In addition, embodiments of the system discussed may be used in a wide range of wireless communication devices such as cellular phone, mobile computers, and other handheld wireless digital devices.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ".

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus comprising:
    a semiconductive body, wherein the semiconductive body includes a first doping region and a second doping region, the first doping region and the second doping region being differently doped;
    an epitaxial film disposed above and on the semiconductive body at the first doping region and not at the second doping region; and
    a diode junction formed between the semiconductive body and the epitaxial film, wherein the diode junction is configured to allow vertical-diode activity through the diode junction.

2. The apparatus of claim 1, wherein the diode junction is defined by a diode junction boundary within the first doping region, and wherein the diode junction boundary is spaced apart from the second doping region.

3. The apparatus of claim 1, wherein the epitaxial film is an epitaxial first film, further including an epitaxial second film disposed adjacent the epitaxial first film.

4. The apparatus of claim 1, further including:
    a silicide first region in the epitaxial first film;
    a silicide second region in the epitaxial second film;
    wherein the diode junction is a diode first junction; and
    a diode second junction disposed between the epitaxial first film and the epitaxial second film, and above the semiconductive body.

5. The apparatus of claim 1, wherein the epitaxial film is an epitaxial first film, further including an epitaxial second film adjacent and spaced apart from the epitaxial first film.

6. The apparatus of claim 1, wherein the epitaxial film is an epitaxial first film, further including:
    an epitaxial second film adjacent and spaced apart from the epitaxial first film; and
    a hard mask disposed between the epitaxial first film and the epitaxial second film.

7. The apparatus of claim 1, wherein the semiconductor body is one of multiple semiconductor fins coupled in parallel.

8. The apparatus of claim 1, wherein the first doping region is coupled to a first contact, and the second doping region is coupled to a second contact.

9. The apparatus of claim 1, further comprising:
    a first contact disposed on the epitaxial film; and
    a second contact disposed upon the semiconductive body at the second doping region.

10. The apparatus of claim 1, wherein the second doping region is formed alongside the first doping region.

11. An apparatus comprising:
    a semiconductive body disposed on a substrate, wherein the semiconductive body includes a first doping region and a second doping region;

an epitaxial first film disposed above and on the semiconductive body at the first doping region and not at the second doping region;

a diode junction formed between the semiconductive body and the epitaxial first film, wherein the diode junction is configured to allow vertical-diode activity through the diode junction;

a silicide first layer disposed on the epitaxial first film;

a silicide second layer disposed on the second doping region; and wherein the silicide second layer is vertically closer to the substrate than the silicide first layer.

12. The apparatus of claim 11, wherein the diode junction is also configured to allow lateral-diode activity between the semiconductive body and the epitaxial film.

* * * * *